United States Patent
Chen

(10) Patent No.: US 7,394,310 B2
(45) Date of Patent: Jul. 1, 2008

(54) SYSTEM AND METHOD FOR PROGRAMMABLE SWITCHING CHARACTERISTICS OF AN ANALOG SWITCH IN A TRANSCONDUCTANCE AMPLIFIER

(75) Inventor: Chun-Ying Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 24 days.

(21) Appl. No.: 10/975,105

(22) Filed: Oct. 28, 2004

(65) Prior Publication Data

US 2006/0044056 A1 Mar. 2, 2006

Related U.S. Application Data

(60) Provisional application No. 60/605,559, filed on Aug. 31, 2004.

(51) Int. Cl.
*G06G 7/26* (2006.01)
(52) U.S. Cl. .................. 327/561; 327/562; 330/253; 330/305
(58) Field of Classification Search ........................ None
See application file for complete search history.

(56) References Cited

U.S. PATENT DOCUMENTS

| | | | | |
|---|---|---|---|---|
| 6,094,093 A | * | 7/2000 | Karanicolas | 327/560 |
| 6,326,838 B1 | * | 12/2001 | Kimura et al. | 327/552 |
| 6,480,064 B1 | * | 11/2002 | Cyrusian | 330/253 |
| 6,590,431 B1 | * | 7/2003 | Das et al. | 327/103 |
| 6,737,919 B2 | * | 5/2004 | Cyrusian | 330/253 |
| 2003/0034849 A1 | * | 2/2003 | Sanduleanu | 331/58 |

FOREIGN PATENT DOCUMENTS

JP 2002-198755 * 12/2002

* cited by examiner

*Primary Examiner*—Tuan T Lam
(74) *Attorney, Agent, or Firm*—Sterne, Kessler, Goldstein & Fox, PLLC

(57) ABSTRACT

Provided are a method and system for controlling impedance in a transconductance amplifier. A system includes a first transconductance amplifier and a second transconductance amplifier configured to control electrical characteristics associated with the first transconductance amplifier. An operational amplifier is provided and has at least one input port connected to the second transconductance amplifier. Also included is a first digital to analog converter (DAC) connected to receive a current signal from the operational amplifier.

16 Claims, 9 Drawing Sheets

SYSTEM AND METHOD FOR PROGRAMMABLE SWITCHING CHARACTERISTICS OF AN ANALOG SWITCH IN A TRANSCONDUCTANCE AMPLIFIER

CROSS-REFERENCE TO RELATED APPLICATIONS

This application claims the benefit of U.S. Provisional Application No. 60/605,559 filed Aug. 31, 2004, which is incorporated herein by reference.

BACKGROUND OF THE INVENTION

1. Field of the Invention

The present invention relates generally to controlling characteristics of transconductance amplifiers.

2. Background Art

In transconductance amplifiers, switching resistance (e.g., degeneration impedance) is a characteristic circuit designers commonly seek to control through use of a number of different techniques. One traditional technique includes providing a transistor-based switch within the transconductance amplifier to control the degeneration impedance characteristics. Although this technique provides a level of control, its use produces several undesirable side-effects. For example, when changes in the degeneration impedance occur in a nonlinear fashion, or occur too quickly, glitches can occur in the output current of the amplifier.

Other traditional approaches to minimizing the effects of these glitches, as well as other instability problems, include the use of resistor capacitor (RC) delay circuits to retard the transition of the switch. The use of RC delay circuits is especially prevalent in low-noise applications, such as within programmable gain amplifiers.

The use of an RC delay circuits, however, requires large resistors and capacitors, which consumes integrated circuit (IC) board real estate. The RC circuits also require use of an extra pin on the IC.

Thus, although traditional techniques are available to minimize the occurrence of glitches and other instability factors in transconductance amplifiers, many of these techniques are costly and/or impractical.

What is needed, therefore, is a more practical approach to minimizing glitches in the output current of transconductance amplifiers caused by controlling the switching resistance. More specifically, what is needed is a method and system to programmably control the switching resistance in a transconductance amplifier. Also, what is needed is a system and method to control the speed at which the resistance switch is turned on and off, in order to further minimize glitches and other instability by-products.

BRIEF SUMMARY OF THE INVENTION

Consistent with the principles of the present invention, as embodied and broadly described herein, the present invention includes a circuit for controlling impedance in a transconductance amplifier. The circuit includes a first transconductance amplifier and a second transconductance amplifier configured to control electrical characteristics associated with the first transconductance amplifier. An operational amplifier is provided and has at least one input port connected to the second transconductance amplifier. Also included is a first digital to analog converter (DAC) connected to receive a current signal from the operational amplifier.

The present invention provides a system and method to generate a programmable switching resistance used in a transconductance amplifier in time and voltage domains. In the present invention, a switch is provided to control the degeneration impedance of the transconductance amplifier. The switch is connected to sources of a differential pair within the transconductance amplifier. The switch can be a hard switch, to turn on and turn off the degeneration path, or a soft switch to tune the total impedance of degeneration with an analog control voltage applied on the switch. In some applications, the switch must also turn on and off within certain time constraints in order to meet system requirements, such as the gain ramping rate, glitch, or stability.

Further features and advantages of the present invention as well as the structure and operation of various embodiments of the present invention, are described in detail below with reference to the accompanying drawings.

BRIEF DESCRIPTION OF THE DRAWINGS

The accompanying drawings which are incorporated herein and constitute part of the specification, illustrate embodiments of the present invention and, together with the general description given above and the detailed description of the embodiments given below, serve to explain the principles of the invention. In the drawings.

DETAILED DESCRIPTION OF THE INVENTION

Figure 1:
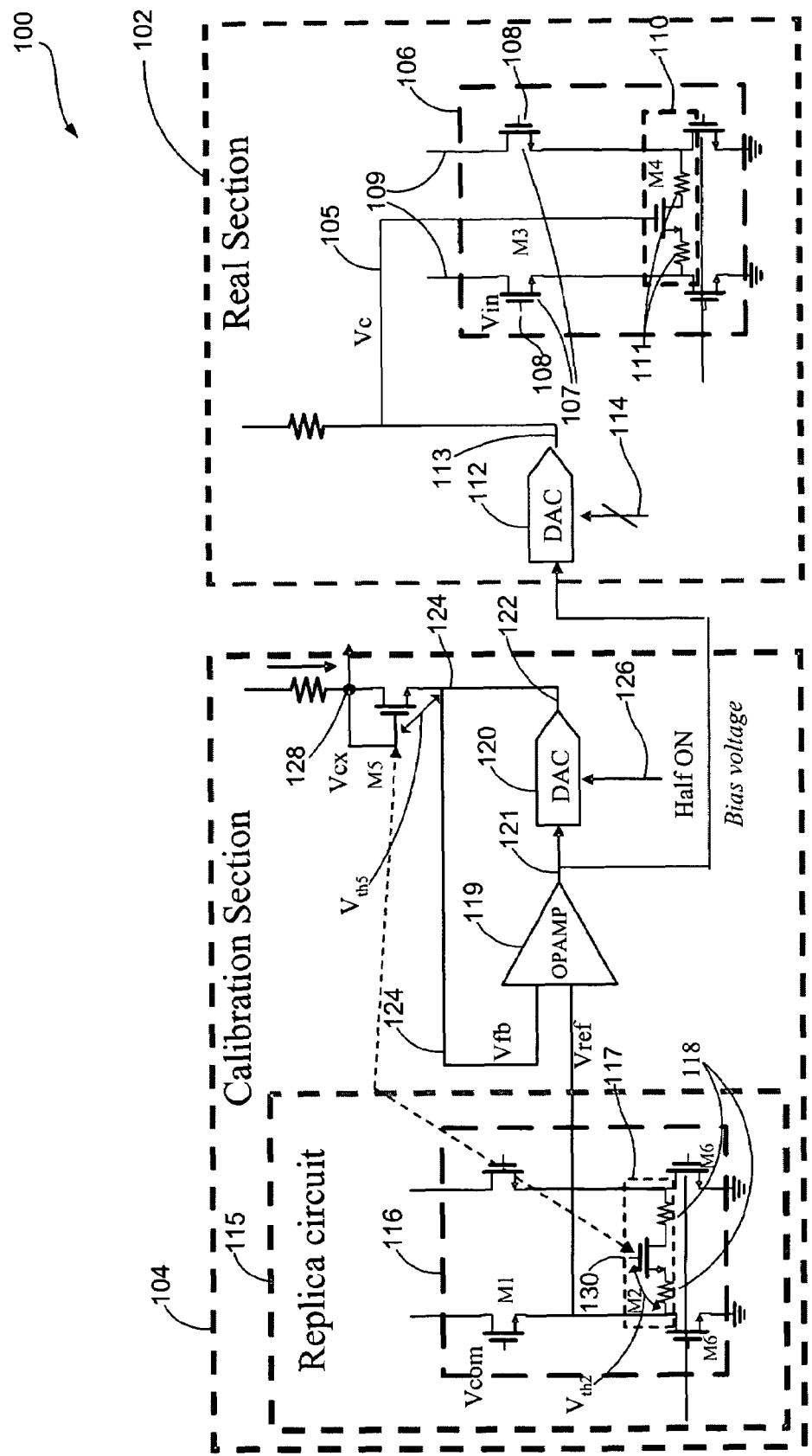
FIG. 1 is a schematic diagram illustration of a circuit constructed in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware, software, firmware, and/or the entities illustrated in the drawings. Any actual software code with the specialized controlled hardware to implement the present invention is not limiting of the present invention.

Thus, the operation and behavior of the present invention will be described with the understanding that modifications and variations of the embodiments are possible, given the level of detail presented herein.

FIG. 1 is a schematic illustration of a transconductance amplifier circuit 100 constructed in accordance with an embodiment of the present invention. The circuit 100 includes a Real Section 102 and a Calibration Section 104 responsible for a control signal along a path 105. The real section 102 includes a first transconductance amplifier 106, including a first differential transistor pair 107 having gates 108. The transconductance amplifier 106 is configured to receive an input voltage $V_{IN}$ as an input to the gates 108, and produce a proportional output current at output port 109.

The transconductance amplifier 106 also includes a switching circuit 110 including resistors 111 coupled to a transistor M4. A digital-to-analog converter (DAC) 112 is used to provide an analog voltage control signal via an output port 113, based upon an input digital data word provided at an input port 114 of the DAC 112.

The calibration section 104 is used to reproduce operating conditions associated with the Real Section 102. More specifically, the calibration section 104 is provided to create operating conditions that are necessary to produce and control a voltage control signal ($V_C$). The control signal $V_C$ is provided along the path 105 as an input to a gate of the transistor M4. In other words, the calibration section 104 provides an operating condition necessary to produce the control signal $V_C$. The voltage control signal $V_C$ is required to slowly turn on and turn off the switch 110 in the transconductance amplifier 106.

The calibration section 104 includes a replica circuit 115 including a replica transconductance amplifier 116 (replicating the amplifier 106) configured to receive, for example, an input common-mode voltage ($V_{COM}$) at a gate of a transistor M1. The transconductance amplifier 116 does not need to input the actual input voltage ($V_{IN}$), as provided to the gate 108 of the transistor 107 within the Real Section 102. Instead, a common mode voltage ($V_{COM}$) of the input voltage ($V_{IN}$) is provided to the gate of the transistor M1.

The replica transconductance amplifier 116 also includes a switch 117, comprising resistors 118 and a transistor M2. The transistor M2 is used as a switch to turn on and off an internal resistance of the switching circuit 117. In some applications, the switching circuit 117 is desirably turned on and off slowly. For example, if the switch 117 is turned on at $V_{dd}$, then the transistor M2 must reach $V_{dd}$ slowly, and must turn off slowly, to avoid a potential current glitch.

If the transistor M2 turns on too quickly, its gain will suddenly change, thus producing the glitch. In order for the transistor M2 to be turned on and off, its threshold voltage ($V_{th2}$) must be known. For purposes of illustration, an effective source-drain resistance of the switch 117 is denoted herein as $R_{SW}$. The $V_{th2}$ varies with process and has body effect if its substrate voltage is different from source node. The source/drain voltage is dependent on the common mode voltage of input signal.

Also within the calibration section 104, a control voltage ($V_{CX}$) is applied to a gate of the transistor M2. As the control voltage $V_{CX}$ is increased, the resistance $R_{SW}$ decreases and eventually becomes negligibly small, as indicated in FIG. 2.

Figure 2:
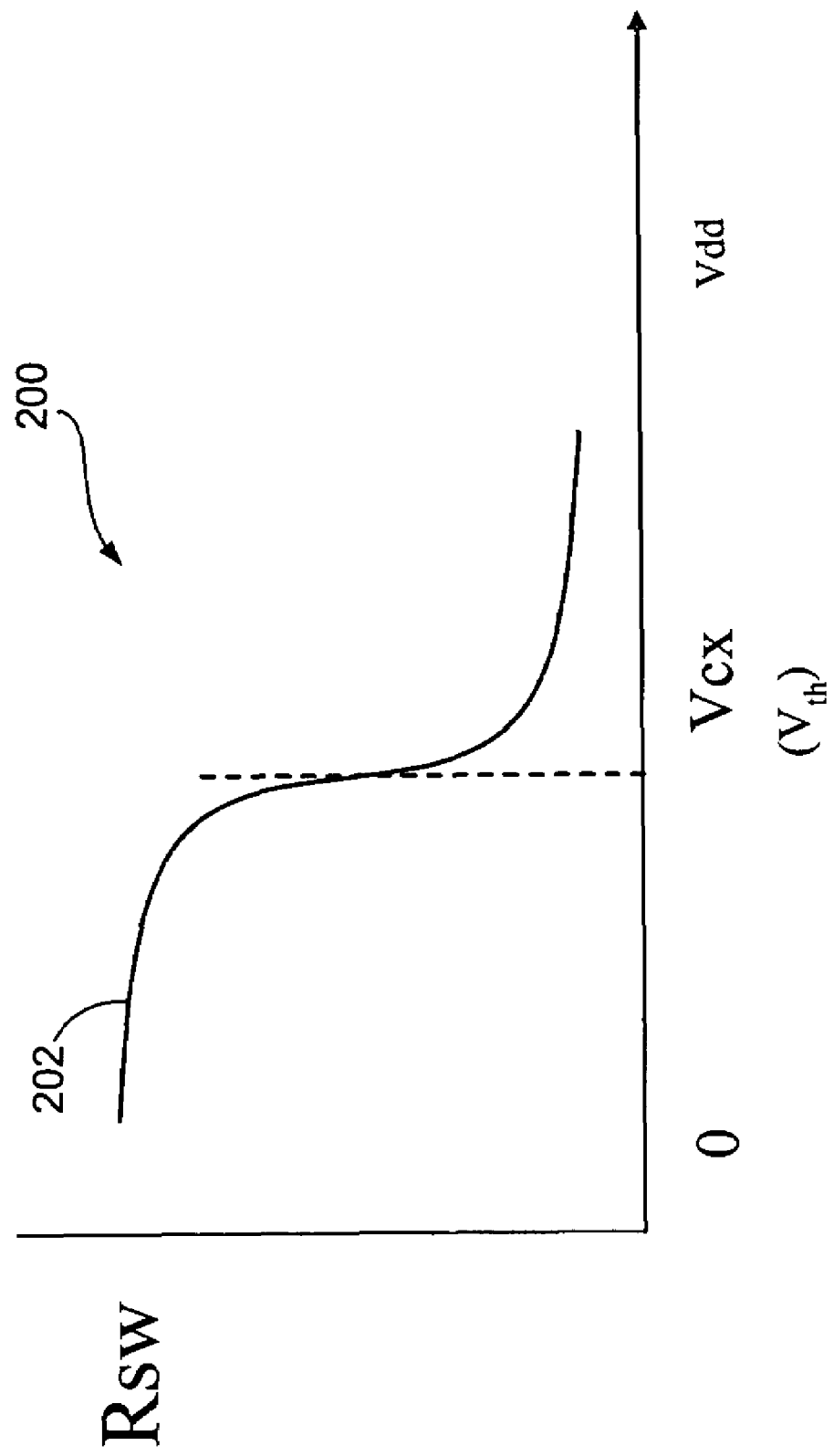
FIG. 2 is a detailed schematic diagram illustration of a digital-to-analog converter (DAC) used in the illustration of FIG. 1.

FIG. 2 is a graphical illustration 200 of a relationship between the switch resistance $R_{SW}$ and the control voltage $V_C$. This relationship is conveyed in the form of a voltage resistance curve 202. In FIG. 2, as the control voltage $V_{CTRL}$ increases and exceeds voltage $V_{CX}$ (equivalent to $V_{th2}$), the switch resistance $R_{SW}$ suddenly changes and becomes small, and a channel is formed within the transistor M2.

The idea behind the present invention, is that if the threshold voltage $V_{th2}$ can be known and created within the calibration section 104 (referring back to FIG. 1), the real section 102 can be programmed based upon the threshold voltage $V_{th2}$ to slowly turn on the transistor M4 within the switch 110. Therefore, the calibration section 104 is used to create a threshold voltage ($V_{th4}$) for application to the transistor M4. In other words, the calibration section 104 replicates the estimated operating conditions of the real section 102.

In order to create the proper operating conditions for the real section 102, the calibration section 104 also includes an operational amplifier 119, a DAC 120, and a transistor M5. The operational amplifier 119 produces an output 121 in the form of a bias voltage that is provided as an input to the DAC 120 and the DAC 112. The DAC 120 produces an output at an output port 122 which is connected along a feedback path 124 to a source of the transistor M5 and to an input port of the operational amplifier 119. The DAC 120 also includes an input port 126 for receiving a digital programming word.

The transistor M5 is desirably substantially similar to the transistor M2. Once an electrical loop along the path 124 is closed, a threshold voltage ($V_{th5}$) associated with the transistor M5 will be substantially equal to the threshold voltage $V_{th2}$ associated with the transistor M2. Also, when the loop 124 is closed, a voltage $V_{fb}$ will be equal to a voltage ($V_{ref}$ provided as the other input to the operational amplifier 119.

The loop 124 forces the voltage $V_{fb}$ equal to the voltage $V_{ref}$. When this happens, the voltage $V_{CX}$ at a node 128 and associated with the transistor M5, will become equal to a voltage occurring at the gate 130 of the transistor M2. These voltage equivalences occur because of the similarities between the transistors M2 and M5. In this analogy, the voltage $V_{th2}$ is the voltage that barely turns on the transistor M2. Thus, through derivation, $V_{CX}=V_{th2}$=the voltage that barely turns on M2.

The operational amplifier 119 and the DAC 120 play an integral role in producing the operating conditions for the real section 102. For example, the DAC 120 is used to generate a programmable switch control voltage based on turn-on threshold voltage $V_{th2}$ produced by the calibration circuit.

In the calibration section 104, $V_{COM}$ is the common-mode voltage of the input voltage ($V_{IN}$) to the replica transconductance amplifier 116. $V_{ref}$ is the source voltage of the transistor M1. $V_{fb}$ is the source voltage of the transistor M5. The operational amplifier 119 forces $V_{ref}$ and $V_{fb}$ equal in steady state. $V_{ref}=(V_{COM}-V_{thM1})$, where $V_{thM1}$ is a gate-to-source voltage of the transistor M1. On the other hand, $V_{CX}=V_{th5}+V_{FB}$, where $V_{th5}$ is the gate-to-source voltage of the transistor M5.

Since $V_{fb}=V_{ref}$, a body effect of the transistor M5 is the same as that of the transistor M2. Since the transistor M2 is close to a pseudo ground of the differential pair transistors M6, there is no direct current (DC) flowing in/out of the transistor M2. The turn-on threshold voltage $V_{th2}$ of the transistor M2, between its gate and its source, is very close to the intrinsic threshold voltage of the transistor M2 with body effect, which is also very close to $V_{th5}$ if the transistor M5 has a low over-drive voltage.

Since the source voltage of the transistor M2=$V_{COM}-V_{thM1}$, the turn-on threshold voltage for M2=$V_{COM}-V_{thN1}+V_{th2}$=Vref+Vth5=Vfb+Vth5, which is equal to $V_{CX}$. Thus, $V_{CX}$ is equivalent to the threshold voltage $V_{th2}$ that turns on the transistor switch M2. The voltage $V_{CX}$ is also the output of the DAC 112, as illustrated in FIG. 3.

Figure 3:
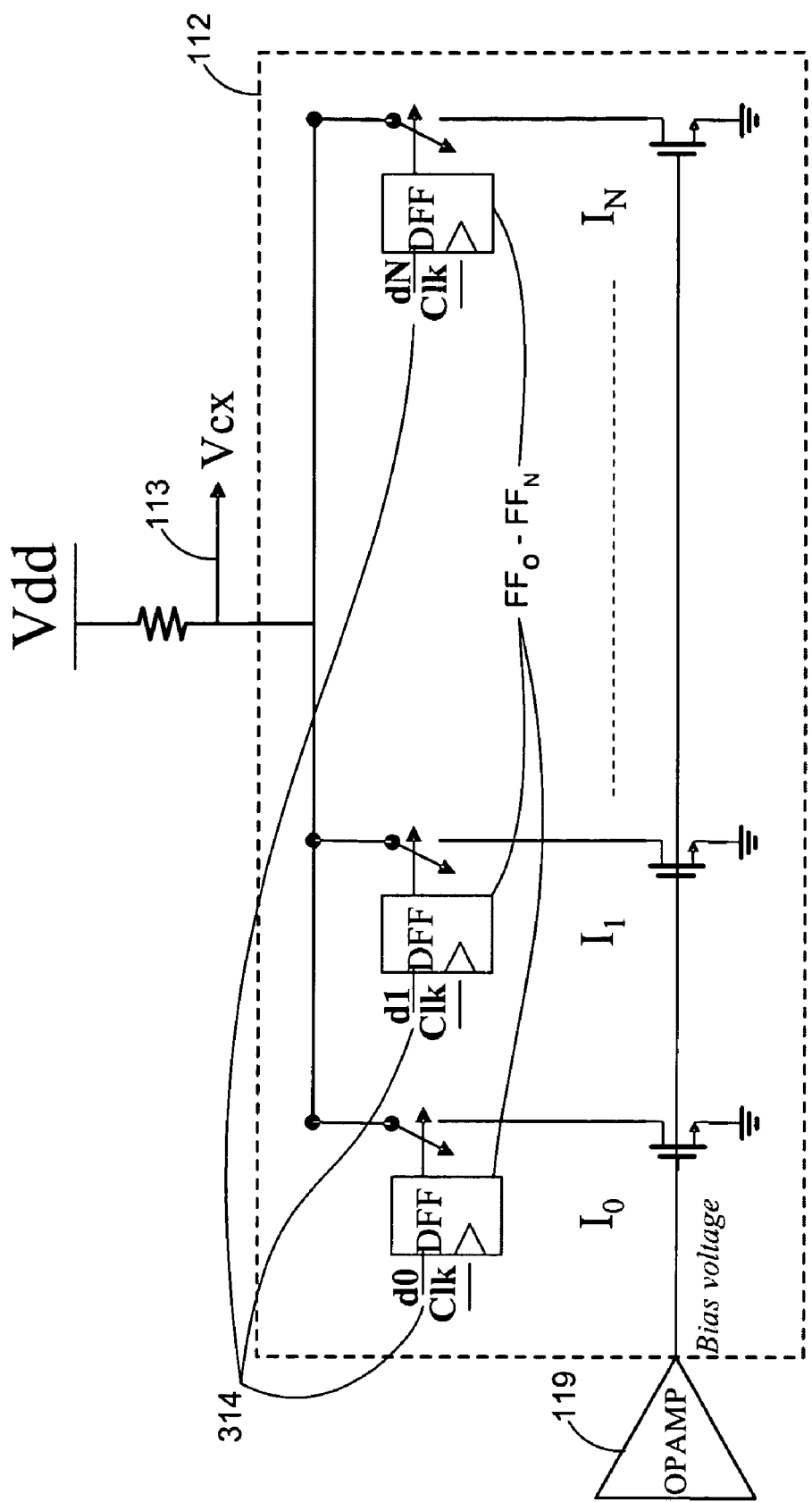
FIG. 3 is a graphical illustration of current distribution associated with DACs in conventional switching circuits used in transconductance amplifiers.

FIG. 3 is a more-detailed schematic illustration of the DAC 112 shown in FIG. 1. The DAC 112 is implemented as a non-linear DAC, based on a sum of programmable current sources $I_0$-$I_N$ with a resistance load. The amount of current in the DAC 112 is controlled by an output current produced by the operational amplifier 119. The DAC 112 is configured to receive a digital input code value via the input port 114. If the digital input code is at a mid-code value, an output voltage of the DAC 112 will produce the voltage $V_{CX}$ as a central voltage value.

In the DAC 112, the input port 114 is programmable and provides external connections to input ports $D_0$-$D_N$ of flip-flop $FF_0$-$FF_N$. The flip-flops $FF_0$-$FF_N$ include a clock input port CLK for receiving an input clocking signal. The DAC 112 will be discussed in greater detail below.

Figure 4:
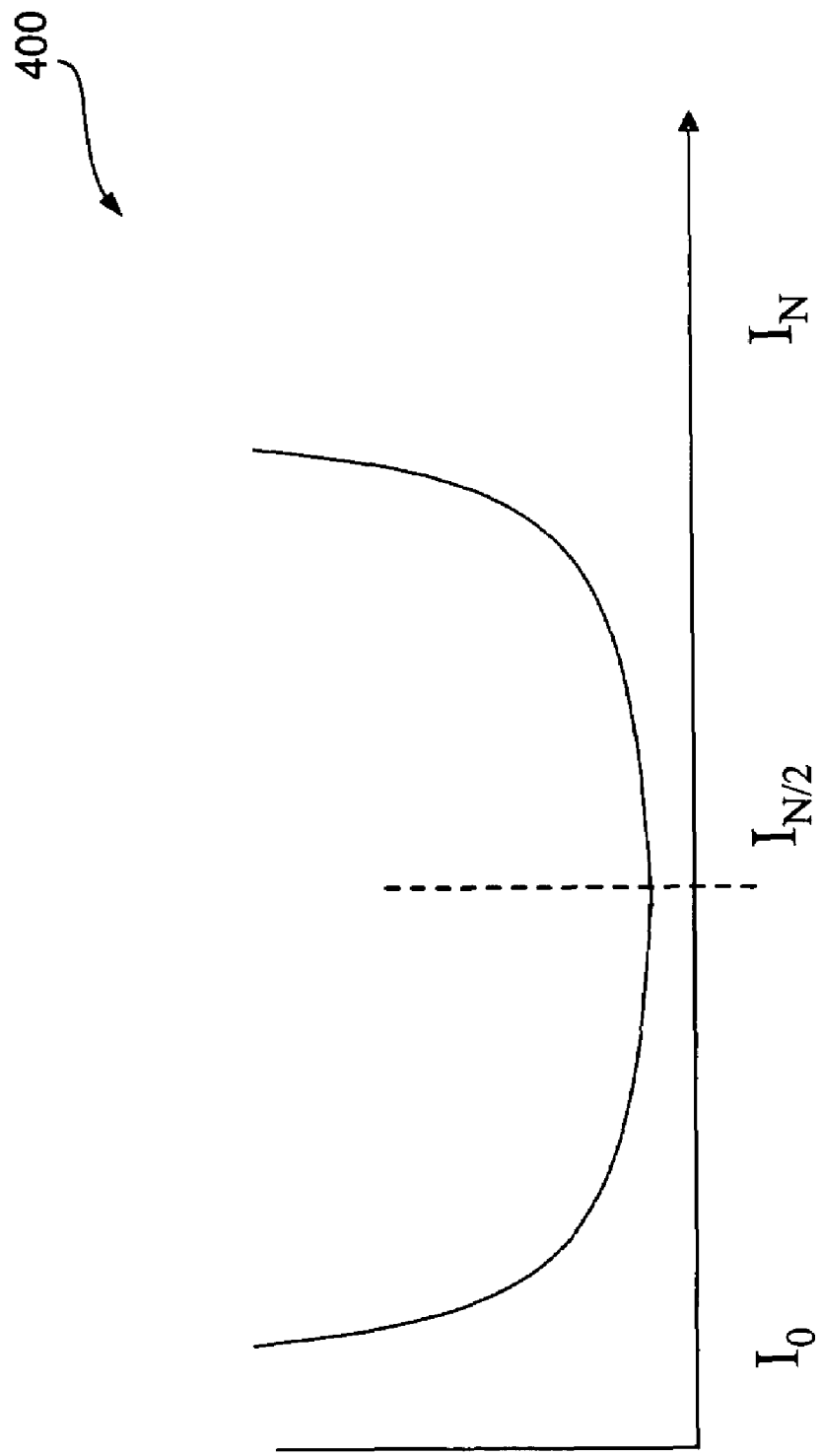
FIG. 4 is a graphical illustration of output voltage characteristics of a DAC used in a conventional switch.

FIG. 4 is a graphical illustration 400 of an exemplary nonlinear current source DAC, such as the DAC 112 of FIG. 1. In the example of FIG. 4, the DAC current sources are symmetrical (or asymmetrical depending on the switching characteristics) at a center location. That is, for example, the DAC 112 has its minimum current in a middle of the curve 400. Since the calibration section 104 is programmed at a half-on condition, characteristics of an output of the DAC 112 will be centered at the voltage $V_{CX}$, as illustrated below in FIG. 5.

Figure 5:
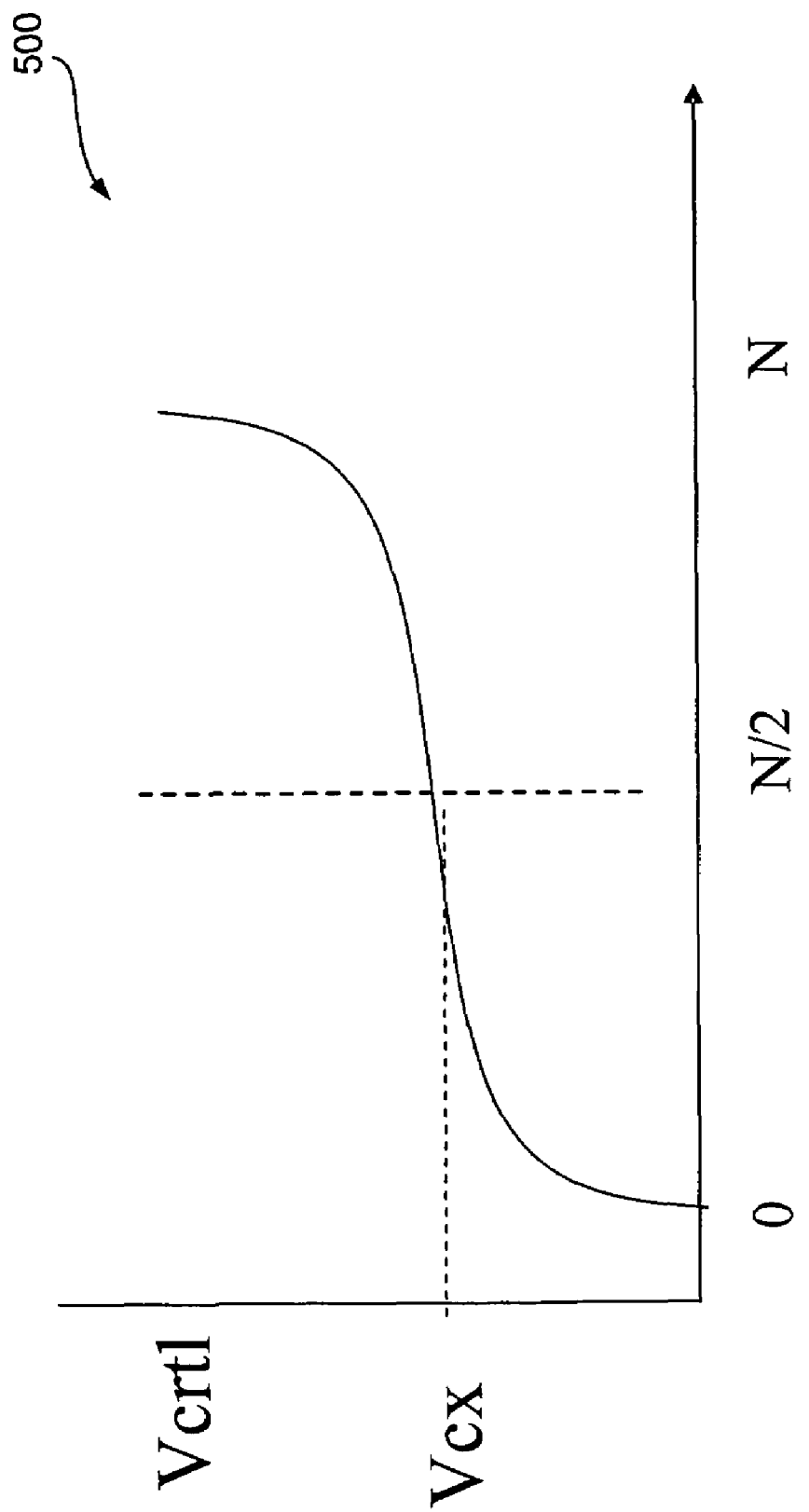
FIG. 5 is a graphical illustration of turn on/turn off characteristics of a conventional switch.

FIG. 5 is a graphical illustration 500 of voltage distribution within the DAC 112, based upon multiple current sources within the DAC 112, as illustrated in FIG. 3, discussed above.

In general, DACs can be implemented as a collection of current sources with switches. If a DAC, such as the DAC 112, is, for example, a 3-bit DAC, then the DAC 112 will include eight switches (e.g., $2^3$). Therefore, an exemplary input code for a 3-bit DAC might be 0, 1, 2, ... 7. When the DAC 112 is configured to be half-on, only the switches 0-3 are set to their on position. The switches numbered 4-7 are set to their off position. If the current source distribution in the current sources $I_0$-$I_N$ is nonlinear, as illustrated in FIG. 4, the current will change very small in the middle, but changes more quickly on both sides (i.e., at the edge of the curve). Because the curve 400 desirably changes very gradually in the middle, that middle section of the curve 400 will have the highest slope (slow region). Therefore, a middle voltage value will desirably change very slowly.

At each edge of the curve 400, however, the change of current source is large. Thus, by combining the current source distribution of FIG. 4 and the code values illustrated above, a nonlinear curve will be produced.

FIG. 5 is a graphical illustration of a nonlinear curve 500 produced by combining the current source distribution of FIG. 4 and the code values above. In FIG. 5, in other words, at or about the mid-code value, the control voltage ($V_{CX}$) changes slowly. But near the outer region, the code changes very quickly.

FIG. 2 is an illustration of nonlinear resistance characteristics $R_{SW}$ as a function of control voltage $V_{CTRL}$ for the transistor M4. When $V_C$ is less than $V_{CX}$, the transistor M4 is in its off state. When $V_C$ is greater than $V_{CX}$, the transistor M4 starts to turn on, and its associated turn-on resistance starts to drop. When combining FIG. 5 and FIG. 2, the effective impedance $R_{SW}$ can be illustrated as a function of a desirable digital code value. Such an illustration if shown in FIG. 6.

Figure 6:
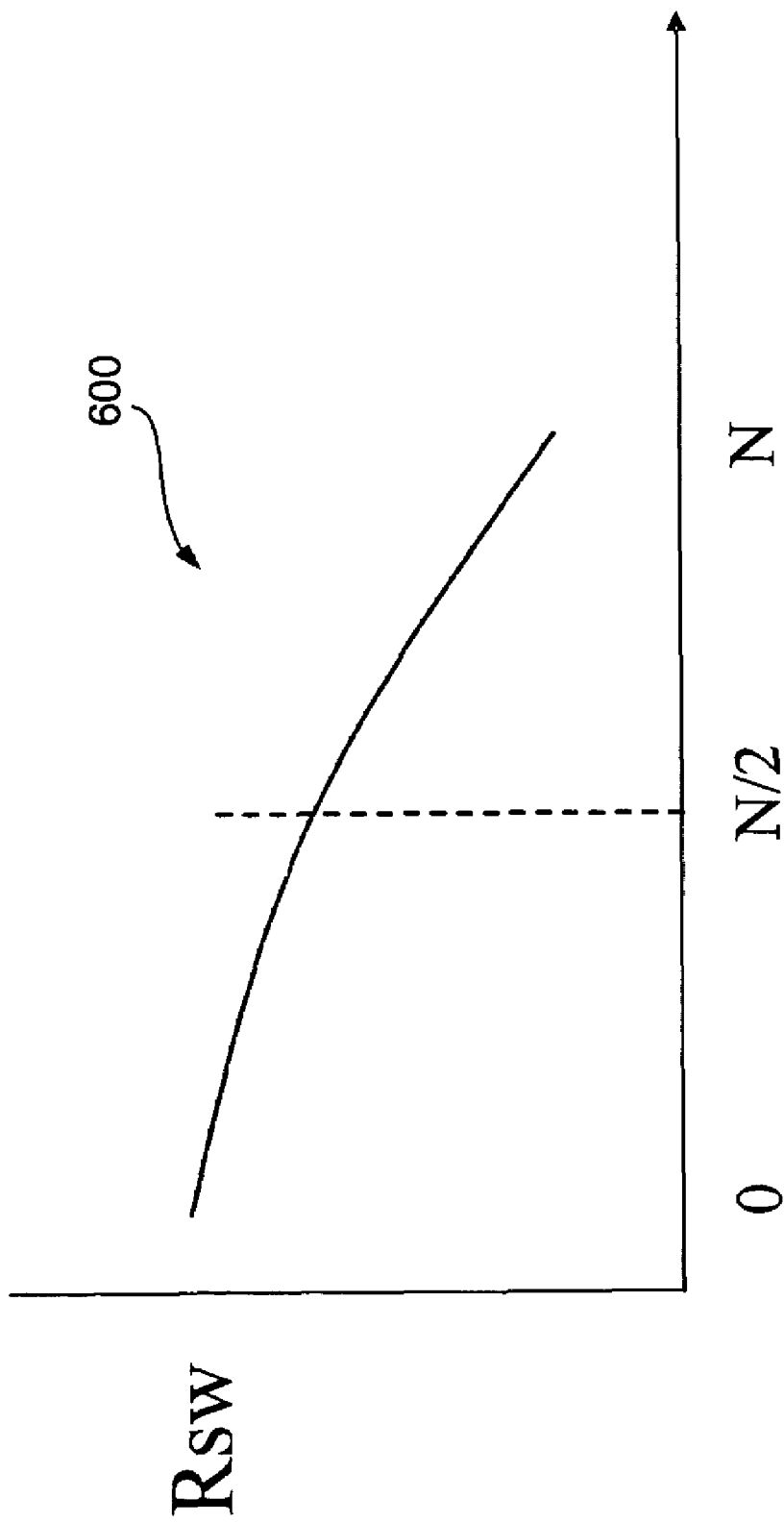
FIG. 6 is a graphical illustration of turn on resistance characteristics of a switch constructed in accordance with an embodiment of the present invention.

FIG. 6 is a graphical illustration indicating that by combining FIGS. 2 and 5, the impedance $R_{SW}$ become substantially linear, since the nonlinear effect of the transistor switch M4 and the DAC 112 will cancel out. For example, the characteristics of the impedance $R_{SW}$ can be controlled in the time domain. More specifically, by multiplying the curve 200 of FIG. 2 by the curve 500 of FIG. 5, the nonlinear curve 600 of FIG. 6 is produced. By changing the code, the on resistance will be linearly changed.

The input digital code provided at the input port 114 of the DAC 112 can be programmed by a waveform having any frequency. By manipulating the frequency of the input waveform, the frequency of sweeps of the DAC 112 are subsequently affected. Thus, in this manner, the input digital code of the DAC 112 enables the DAC 112 to be controlled in the time domain.

Figure 7:
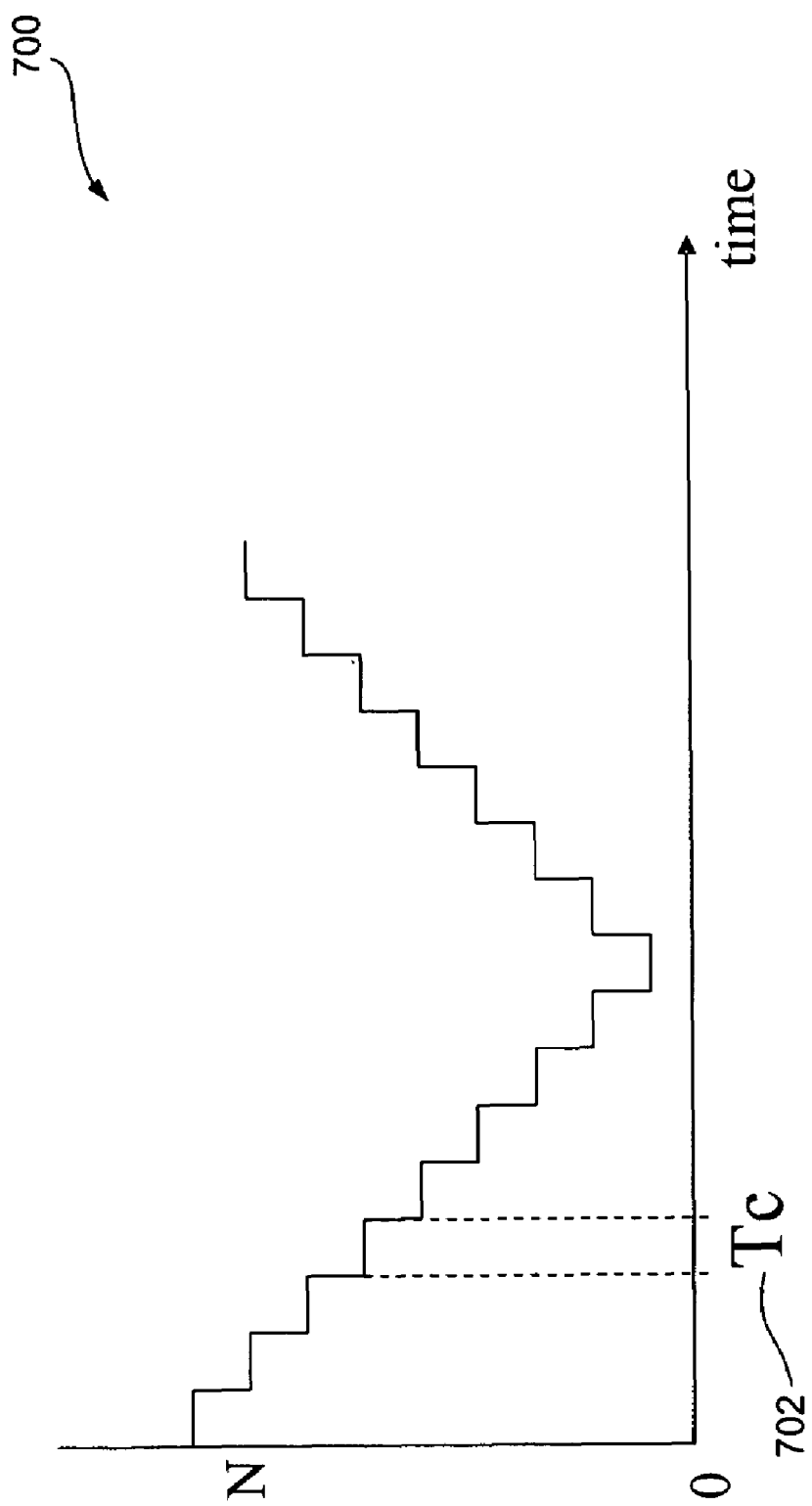
FIG. 7 is a graphical illustration of an exemplary waveform applied to a switch constructed in accordance with an embodiment of the present invention.

FIG. 7 is a graphical illustration of an exemplary waveform 700 representing an input code word that can be used to sweep the DAC 112. The input waveform 700 includes an exemplary clock period 702 for modulating the input code value of the DAC 112 between, for example, input code values 2-4, which represent a middle code value.

Figure 8:
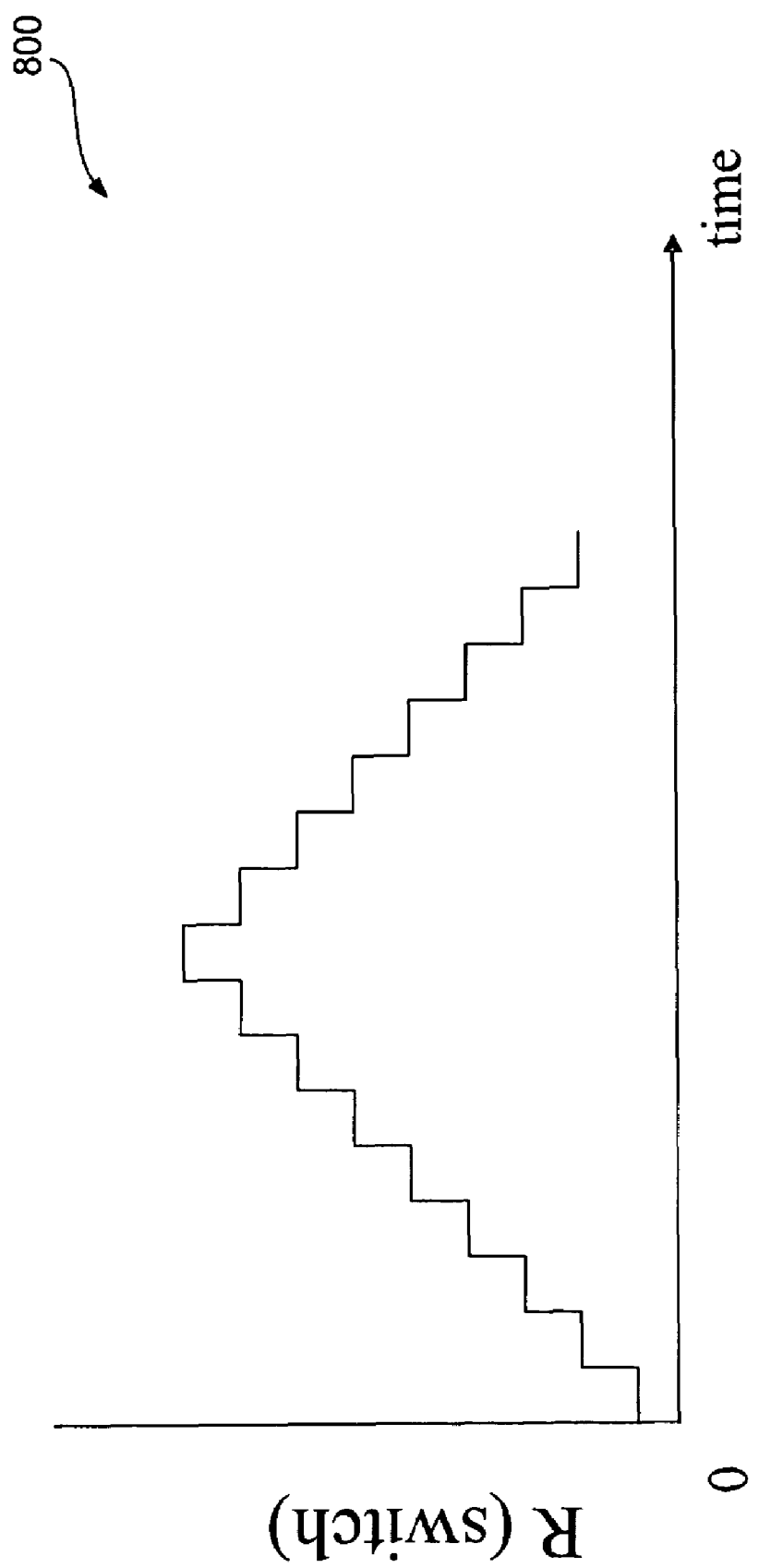
FIG. 8 is a graphical illustration of the effective resistance of a switch constructed in accordance with an embodiment of the present invention.

FIG. 8 is a graphical illustration of the switch impedance $R_{SW}$ in the time domain. That is, a clock waveform 800 is illustrated which can be provided as an input to the clock input of the flip-flops $FF_0$-$FF_N$, to sweep the DAC 112. The resolution of the programmable switch impedance $R_{SW}$ is a function of the resolution of the DAC 112. Changing the number of current sources activated within the DAC 112, changes the voltage. And by changing the clock speeds using exemplary waveforms such as the waveforms 700 and 800 of FIGS. 7 and 8, respectively, the resistance $R_{SW}$ can be programmed in two dimensions of programmability, voltage and time.

The circuit 100, in an alternative embodiment, can also be used as a programmable gain amplifier (PGA). In this alternative embodiment, the resistors 111 and 118 of the switches 110 and 117, respectively, can be removed. By removing the resistors, the switches 110 and 117 can be used not as a switch, but as a voltage-controllable resistance source. That is, if the transconductance has an impedance load, it is a amplifier. Since the gain of amplifier is dependent on the on-resistance of the switch, the programmable on-resistance of the switch can be used to control the gain of an amplifier.

Figure 9:
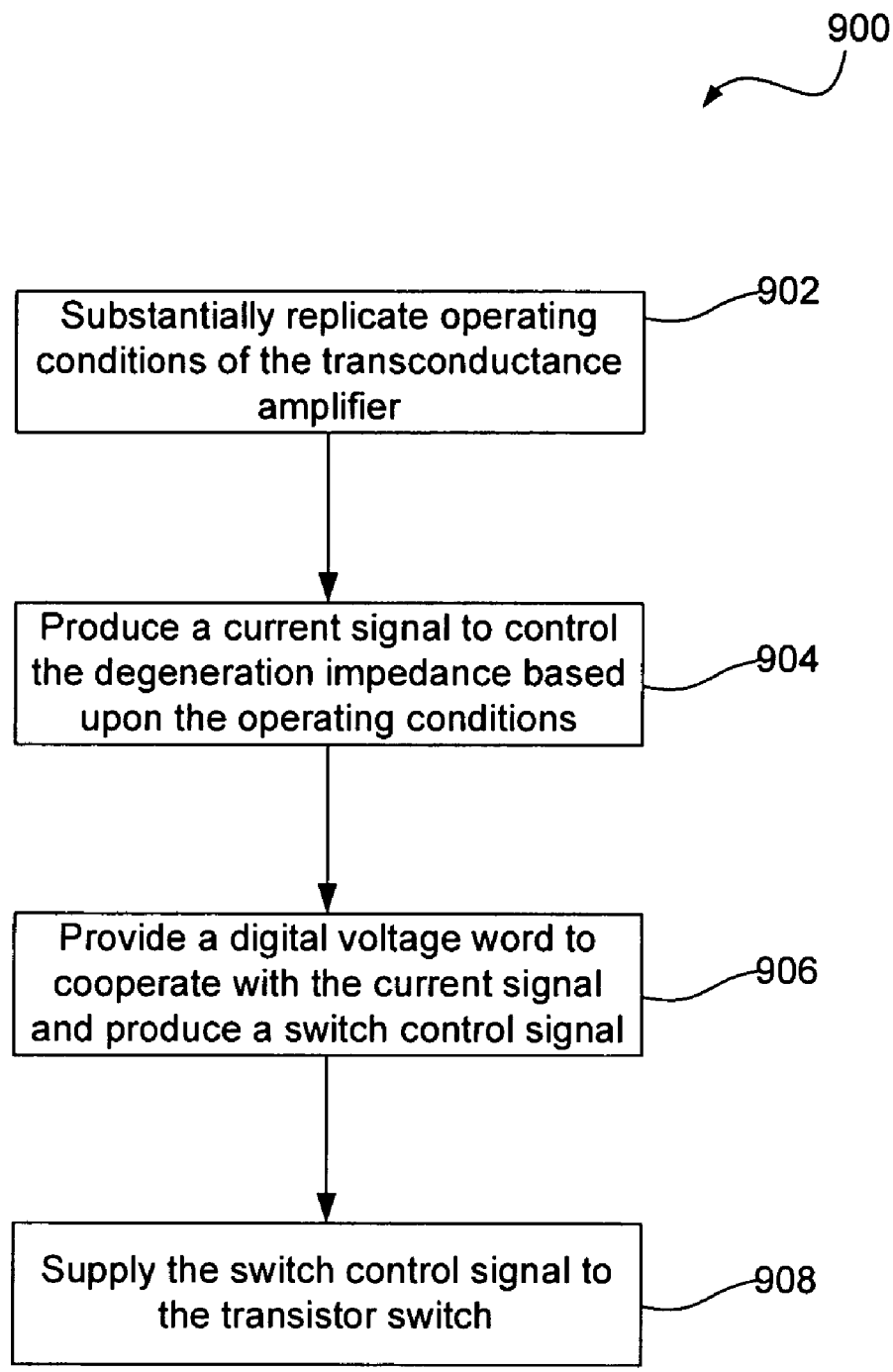
FIG. 9 is a flowchart of an exemplary method of practicing an embodiment of the present invention.

FIG. 9 is a flowchart of an exemplary method 900 of practicing an embodiment of the present invention. In FIG. 9, operating conditions of the transconductance amplifier are substantially replicated, as illustrated in step 902. Once the operating conditions are replicated, a current signal is produced to control the degeneration impedance of the real transconductance amplifier based upon the operating conditions, as noted in step 904. In step 906, a digital word is provided to cooperate with the produced current signal and to produce a switch control signal accordingly. Finally, in step 908, the switch control signal is provided to the transistor switch within the transconductance amplifier 106.

CONCLUSION

The present invention provides a low cost system and method for an analog switch to control the output current in a transconductance amplifier. The output current is controlled through use of a programmable switching resistance, programmable in both time and voltage domains. Additionally, within the system of the invention, the ramp-up and ramp-down rates of the DAC can be precisely controlled using a specific input clocking waveforms.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

I claim:

1. An apparatus, comprising:
   a first transconductance amplifier; and
   a calibration circuit including:
   a second transconductance amplifier, the second transconductance amplifier including substantially structural replica circuit components of the first transconductance amplifier; and
   an operational amplifier having an input port connected to the second transconductance amplifier and a digital to analog converter (DAC) connected to an output port of the operational amplifier, an output port of the DAC connected to an input port of the operational amplifier.

2. The apparatus of claim 1, wherein the calibration circuit further includes an effects transistor having a source connected to an output port of the DAC and having its gate and drain connected together.

3. The apparatus of claim 1, wherein the DAC produces a linear or a non-linear output.

4. A circuit, comprising:
   a first transconductance amplifier;
   a second transconductance amplifier configured to control electrical characteristics associated with the first transconductance amplifier, the second transconductance amplifier including substantially structural replica circuit components of the first transconductance amplifier;
   an operational amplifier having at least one input port connected to the second transconductance amplifier; and
   a first digital to analog converter (DAC) connected to receive a signal from the operational amplifier, the output port of the first DAC connected to an input of the operational amplifier.

5. The circuit of claim 4, wherein the first transconductance amplifier includes a differential transistor pair; and a first switch transistor coupled across sources of the differential pair, a gate of the first switch transistor forming a control port.

6. The circuit of claim 4, wherein the electrical characteristics include degeneration impedance.

7. The circuit of claim 4, wherein the second transconductance amplifier includes a second switch transistor, a gate of the second switch transistor being devoid of an electrical connection.

8. The circuit of claim 7, wherein the first and second switches are analog switches.

9. The circuit of claim 4, wherein the degeneration impedance is programmable in time and voltage domains.

10. The circuit of claim 4, wherein the electrical characteristics are facilitated when the DAC receives a digital input at a substantially given code value.

11. The circuit of claim 4, further comprising an effects transistor having a source connected to an output port of the first DAC, a gate and a drain of the effects transistor being connected together.

12. The circuit of claim 5, further comprising a second DAC configured to receive the signal from the operational amplifier; and wherein an output terminal of the second DAC is connected to the control port.

13. The circuit of claim 12, wherein the second DAC is programmable.

14. The circuit of claim 12, wherein the first and second DACs produce linear and non-linear outputs.

15. The circuit of claim 4, wherein the second transconductance amplifier is configured to generate a threshold voltage.

16. The circuit of claim 4, wherein a voltage created within the second transconductance amplifier is substantially replicated within the first transconductance amplifier.

* * * * *